United States Patent [19]

Katamachi

[11] Patent Number: 5,908,025
[45] Date of Patent: Jun. 1, 1999

[54] WIRE DERAILMENT DETECTING APPARATUS OF WIRE SAW

[75] Inventor: Shozo Katamachi, Mitaka, Japan

[73] Assignee: Tokyo Seimitsu Co., Ltd., Tokyo, Japan

[21] Appl. No.: 08/877,898

[22] Filed: Jun. 18, 1997

Related U.S. Application Data

[62] Division of application No. 08/705,685, Aug. 29, 1996, Pat. No. 5,809,986.

[30] Foreign Application Priority Data

Sep. 8, 1995 [JP] Japan .................................. 7-231250
Sep. 14, 1995 [JP] Japan .................................. 7-236591

[51] Int. Cl.⁶ .................................. B28D 1/12; B28D 1/08
[52] U.S. Cl. .................................. 125/16.02; 125/21
[58] Field of Search .................. 83/65.1; 125/16.01, 125/16.02, 21; 451/8, 9, 10

[56] References Cited

U.S. PATENT DOCUMENTS 5,348,208  9/1994  Tamura .
5,499,774  3/1996  Novak et al. .
5,616,065  4/1997  Egglhuber .................................. 451/10
5,628,301  5/1997  Katamachi .................................. 125/21

FOREIGN PATENT DOCUMENTS 64-16324  1/1989  Japan .
5-42419   2/1993  Japan .

Primary Examiner—Timothy V. Eley
Attorney, Agent, or Firm—Sixbey, Friedman, Leedom & Ferguson; David S. Safran

[57] ABSTRACT

A microswitch is provided near each end of each grooved roller. The microswitch has a rod-shaped contact shoe, and is operated if a wire derailed from the grooved roller contacts the contact shoe. An operational signal is sent from the microswitch to a control apparatus, and the control apparatus receives the operational signal so as to detect that the wire is derailed.

5 Claims, 6 Drawing Sheets

WIRE DERAILMENT DETECTING APPARATUS OF WIRE SAW

This is a Divisional application of Ser. No. 08/705,685, filed Aug. 29, 1996 now U.S. Pat. No. 5,809,986.

BACKGROUND OF THE INVENTION

1. Field of the Invention

The present invention relates to a wire derailment detecting apparatus of a wire saw, and more particularly to a wire derailment detecting apparatus of a wire saw which slices a workpiece such as a semiconductor ingot into a number of wafers by a running wire.

2. Description of the Related Art

In a wire saw, a wire, which runs at a high speed between a pair of wire reels, is wound on a plurality of grooved rollers to form a wire row. The workpiece is pressed against the wire row supplied with manufacturing solution including abrasive grains. As a result, the workpiece can be sliced into a number of wafers by lapping action of the abrasive grains.

In the wire saw, the wire must be prevented from snapping while the workpiece is being sliced. The wire is snapped mainly because the wire is derailed from the grooved rollers forming the wire row, and because the wire is derailed from the guide roller guiding the running wire.

In order to detect whether the wire is derailed, there is a method in that a pair of the wire reels are electrically insulated from a body of the wire saw, and a constant voltage is applied between the wire reels. Then, when a drop in the voltage is detected, then it is determined that the wire is derailed. This method is based on the following facts. That is, many of the grooved rollers and the guide rollers are made of resin such as rubber, polyurethane, polyethylene, or the like. If the wire is normally wound on the rollers, there is a constant difference in voltage between the wire reels. If the wire is derailed, the wire contacts the body of the wire saw, and the voltage is dropped.

The current manufacturing solution of the wire saw is usually oil-based. The oil-based manufacturing solution is faced with problems in which the sliced wafer cannot be cleansed sufficiently, the user becomes stained with the solution, and the environment is polluted. Therefore, a water-based manufacturing solution has been recently developed to an extent that it can be put to practical use.

However, if the conventional method of electrically detecting the derailment is applied to the wire saw performing the slicing by means of the water-based manufacturing solution, the manufacturing solution conducts electricity. Thus, there are disadvantages in that the operation is incorrect and the detection is delayed.

SUMMARY OF THE INVENTION

The present invention has been developed under the above-described circumstances, and has its object the provision of a wire derailment detecting apparatus of a wire saw, which can be applied to a wire saw performing the slicing by means of the water-based manufacturing solution.

In order to achieve the above-mentioned object, a wire derailment detecting apparatus of a wire saw, in which a wire guided by a plurality of guide rollers and travelling between a pair of wire reels is wound on a plurality of grooved rollers to form a wire row, and a workpiece is pressed against said wire row to be sliced into a number of wafers, comprises: switch means provided near each end of each of the grooved rollers, and operated to send an operational signal if the wire derailed from the grooved roller contacts the switch means; and control means for receiving the operational signal sent from the switch means so as to detect whether the wire is derailed from the grooved roller.

According to the present invention, when the wire wound on the grooved rollers is derailed from one of the ends of one of the grooved rollers, it contacts the switch means provided near the end of the grooved roller. If the wire contacts the switch means, the switch means is operated, then the switch means sends the operational signal to the control means. The control means receives the operational signal sent from the switch means so as to detect that the wire is derailed from the grooved roller.

In order to achieve the above-mentioned object, a wire derailment detecting apparatus of a wire saw, in which a wire guided by a plurality of guide rollers and travelling between a pair of wire reels is wound on a plurality of grooved rollers to form a wire row, and a workpiece is pressed against the wire row to be sliced into a number of wafers, comprises: means for measuring the number of rotations of each guide roller of the plurality of guide rollers while the workpiece is being sliced; and control means for comparing the number of rotations of the guide roller measured by the means for measuring the number of rotations, and a predetermined reference number of rotations of the guide roller, so as to detect whether the wire is derailed from the guide roller.

According to the present invention, the means for measuring the number of rotations measures the number of rotations of the guide roller while the workpiece is being sliced, and the measurement result is sent to the control means. On the other hand, the control means compares the number of rotations of the guide roller during the slicing of the workpiece, which is sent from the means for measuring the number of rotations, and the predetermined reference number of rotations of the guide roller. In this case, if the wire is normally wound on the guide roller, the number of rotations during the slicing of the workpiece, which is measured by the means for measuring the number of rotations, is substantially equal to the reference number even if the wire is slippery. However, if the wire is derailed from the guider roller, the guide roller does not rotate, so that the number of rotations during the slicing is not equal to the reference number. When the wire is wound on the portion of the guide roller other than the grooved portion, the number of rotations during the slicing is less than or more than the reference number. Therefore, when the difference between the number of rotations during the slicing of the workpiece and the reference number is out of a permissible range, the control means determines that the wire is derailed from the guide roller.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENTS

Figure 1:
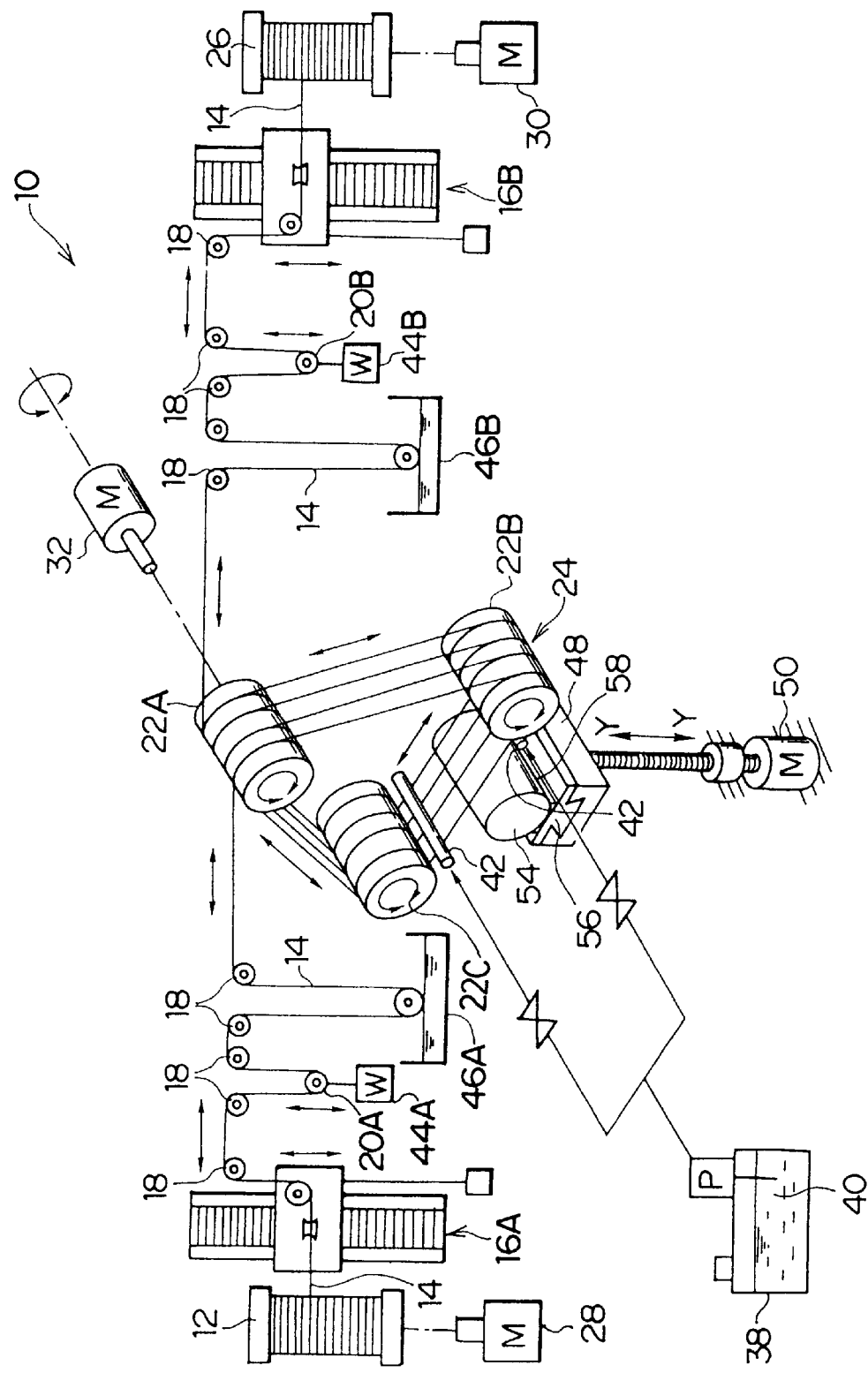
FIG. 1 is a view illustrating the structure of the whole wire saw.

First, an explanation will be given about the structure of a wire saw. FIG. 1 is a view illustrating the structure of the whole wire saw 10.

As shown in FIG. 1, a wire 14 wound on one wire reel 12 is wound on three grooved rollers 22A, 22B, and 22C, which are arranged in such a manner to form a triangle, via a wire guiding apparatus 16A, a plurality of guide rollers 18,18, . . . , and a dancer roller 20A. The wire 14 forms a wire row 24. The wire 14 forming the wire row 24 is wound up by the other wire reel 26 via a plurality of guide rollers 18,18, . . . , a dancer roller 20B, and a wire guiding apparatus 16B.

The wire guiding apparatuses 16A and 16B guide the wire 14 so that the wire 14 can be reeled out of the wire reels 12 and 26 at a constant pitch, and so that the wire 14 can be wound up by the wire reels 12 and 26 at a constant pitch. The guide roller 18 is disposed at a predetermined position of a wire travelling path so as to guide the wire 14 running between a pair of the wire reels 12 and 26. Weights 44A and 44B of a predetermined weight are hung from the dancer rollers 20A and 20B to always apply a constant tension to the traveling wire 14.

Wire cleansing apparatuses 46A and 46B are provided on the wire travelling path. The wire cleansing apparatuses 46A and 46B eliminate manufacturing solution 40 adhered to the circumference of the wire 14 by passing the travelling wire 14 through the cleansing solution.

Motors 28 and 30, which are able to rotate in the forward and backward directions, connect to a pair of the wire reels 12 and 26, respectively. The motors 28 and 30 are driven so that the wire 14 can travel back and forth between a pair of the wire reels 12 and 26. A motor 32, which is able to rotate in the forward and backward directions, connects to the grooved roller 22A. The motor 32 is controlled to be driven synchronously with the motors 28 and 30.

The wire row 24 is supplied with slurry 40 (manufacturing solution) stored in a slurry storage tank 38, via slurry supplying nozzles 42A and 42B. The slurry 40 supplied to the wire row 24 includes abrasive grains (ordinarily, abrasive grains of approximately GC #600–#1000 are used). A workpiece is sliced by lapping action of the abrasive grains.

A work feed table 48, which is driven by a work feed motor 50 to move up and down, is disposed below the wire row 24. A semiconductor ingot 54 as the workpiece is fixed to the work feed table 48 via an ingot mounting block 56 and a slice base mounting beam 58. The work feed table 48 is lifted toward the wire row 24 so that the semiconductor ingot 54 can be pressed against the wire row 24 running at a high speed and can be sliced into a number of wafers.

Next, an explanation will be given about the wire derailment detecting apparatus according to the present invention. In order to detect whether the wire 14 is derailed, there are two cases when the derailment of the wire 14 from the grooved roller 22A, 22B or 22C is detected, and when the derailment of the wire 14 from the guide roller 18 is detected. First, an explanation will be given about the case when the derailment of the wire 14 from the grooved roller 22A, 22B, or 22C is detected.

Figure 2:
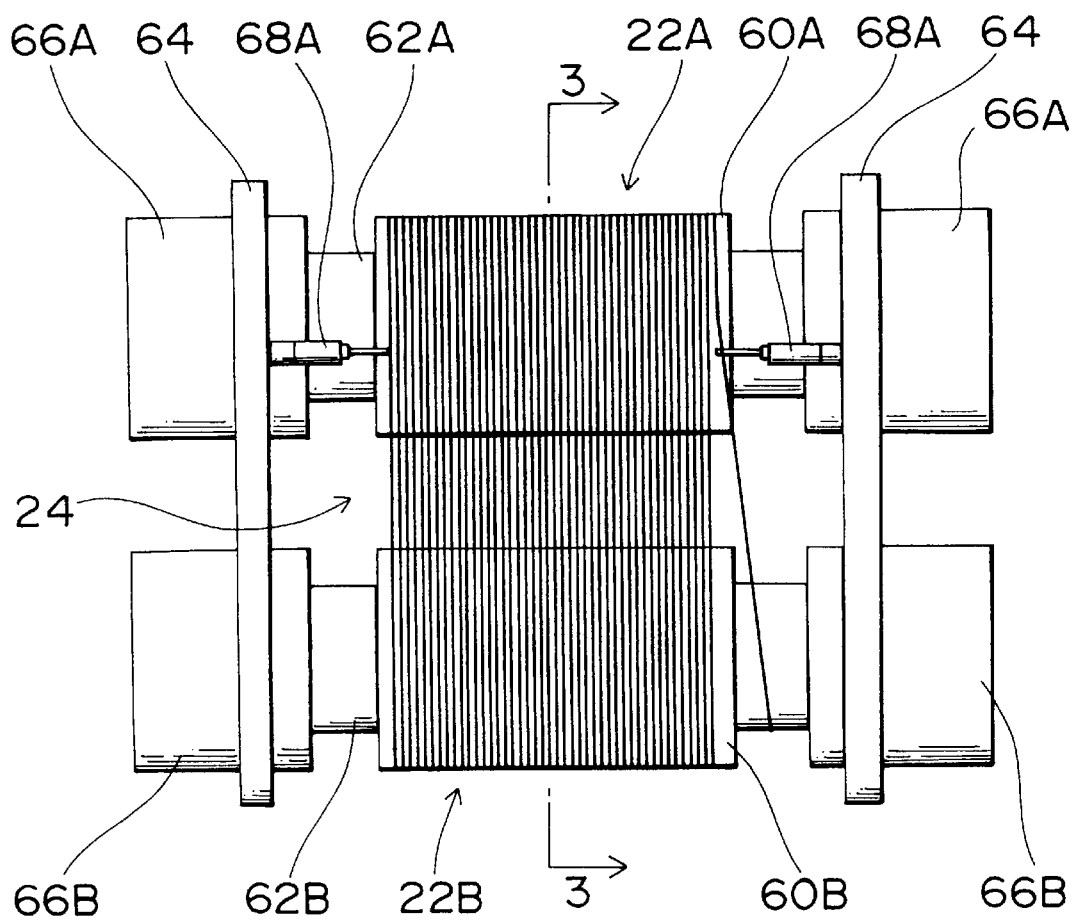
FIG. 2 is a side view illustrating grooved rollers.
Figure 3:
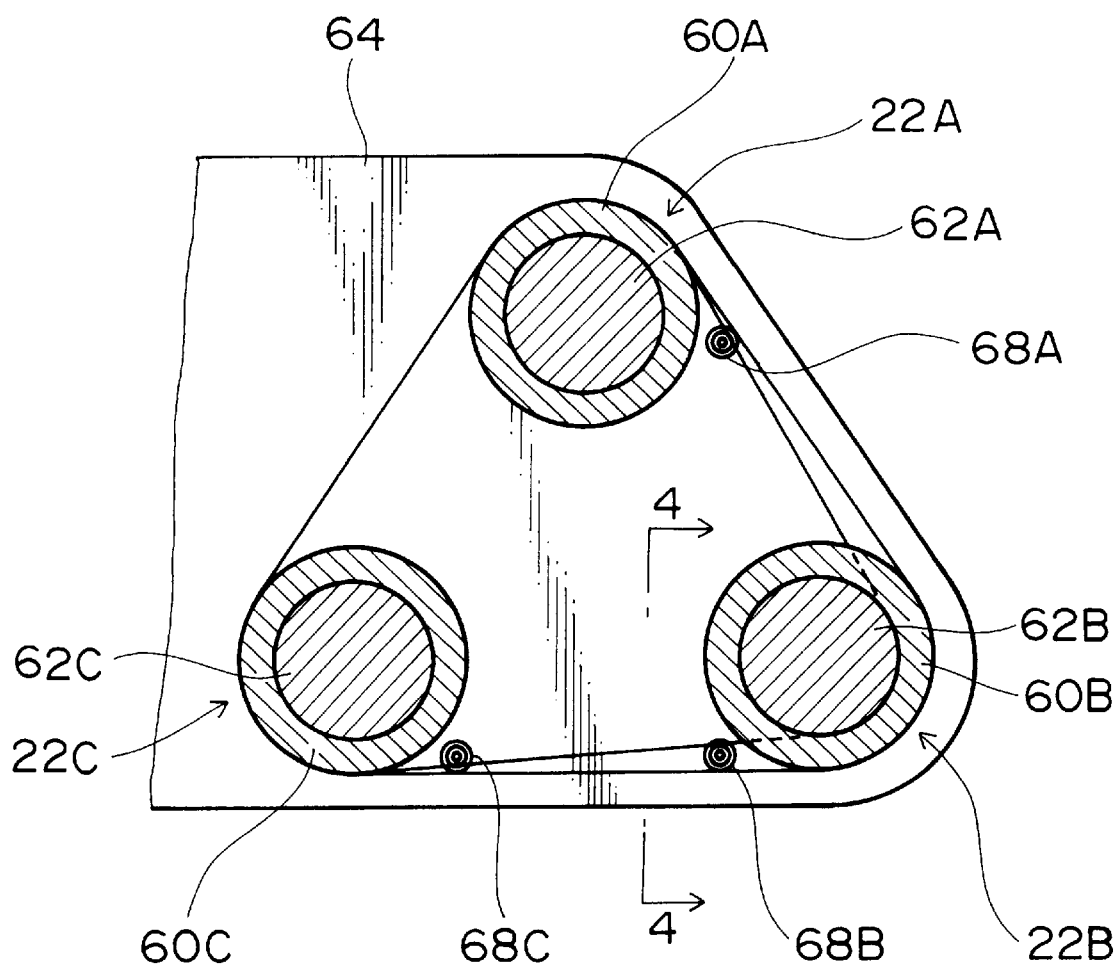
FIG. 3 is a sectional view taken along line 3—3 in FIG. 2.

FIG. 2 is a side view illustrating the grooved rollers 22A, 22B, and 22C. FIG. 3 is a sectional view illustrating along line 3—3 in FIG. 2.

As shown in FIGS. 2 and 3, the grooved rollers 22A, 22B and 22C are constructed in such a manner that spindles 62A, 62B and 62C are engaged with the center of rollers 60A, 60B, and 60C made of polyurethane. Many grooves are formed on the outer circumference of the rollers 60A, 60B and 60C at a constant pitch. The wire 14 is wound on the grooves sequentially so as to form the wire row 24.

The grooved rollers 22A, 22B and 22C are rotatably held by a pair of holding plates 64 and 64, which both ends are fixed to a body frame (not shown) of the wire saw, via bearings 66A, 66A, 66B, 66B, 66C, and 66C.

Microswitches 68A, 68A, 68B, 68B, 68C, and 68C are provided on a pair of the holding plates 64 and 64 near the holding parts of the grooved rollers 22A, 22B and 22C.

Figure 4:
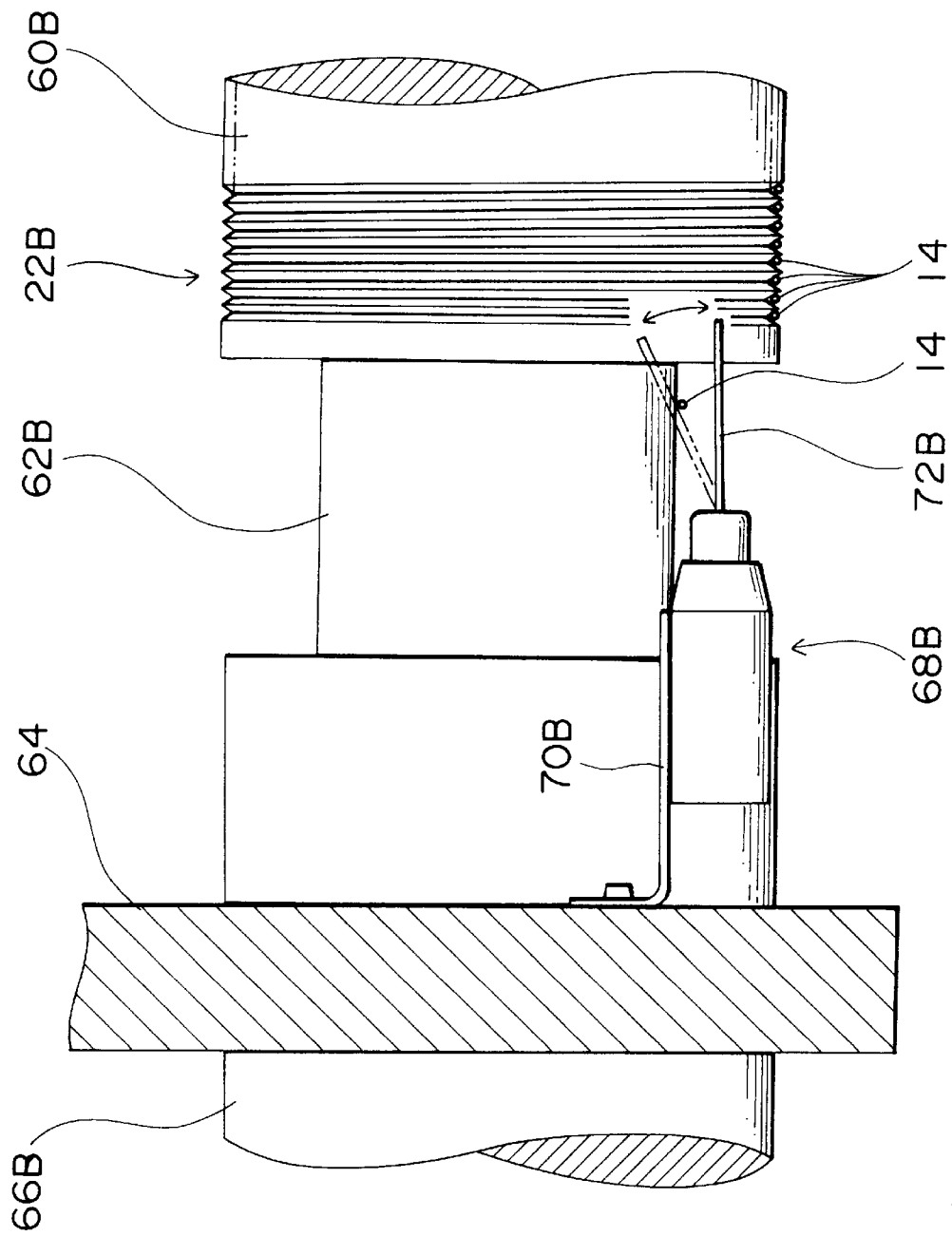
FIG. 4 is a sectional view taken along line 4—4 in FIG. 3.

As shown in FIG. 4, the microswitch 68B is attached to the holding plate 64 via a bracket 70B. The microswitch 68B is provided with a rod-shaped contact shoe 72B. If the wire 14 contacts the contact shoe 72B, the microswitch 68B is operated.

Therefore, the microswitch 68B is attached to the holding plate 64 so that the derailed wire 14 can contact the contact shoe 72B without fail when the wire 14 is derailed from the grooved roller 22B.

Other microswitches 68A and 68C are constructed in the same manner. When the wire 14 is derailed from the grooved roller 22A, 22B or 22C, the microswitch 68B, 68B and 68C are attached to the holding plate 64 so that the derailed wire 14 can contact the contact shoe 72A, 72B, or 72C.

When the microswitch 68A, 68B or 68C is operated, it sends an operational signal to a control apparatus (not shown). When the control apparatus receives the operational signal, it determines from which roller of the grooved rollers 22A, 22B, and 22C the wire is derailed. At the same time, the control apparatus stops the motors 28, 30, and 32 of the wire reels 12 and 26, and the grooved roller 22A, and stops the work feed motor 50.

The wire derailment detecting apparatus constructed in the above-mentioned manner detects whether the wire 14 is derailed from the grooved roller 22A, 22B, or 22C in the following way.

As shown in FIG. 1, the wire 14 reeled out of one wire reel 12 is wound up by the other wire reel 26 via the wire guiding apparatus 16A→ the guide roller 18→ the dancer roller 20A→ the three grooved rollers 22A, 22B, and 22C→ the guide roller 18→ the dancer roller 20B→ the wire guiding apparatus 16B.

The wire 14 is wound on a number of grooves on the outer circumference of the rollers 60A, 60B, and 60C, so that the wire row 24 is formed at the three grooved rollers 22A, 22B and 22C.

However, if the user makes a mistake in winding the wire 14, or if some trouble occurs, the wire 14 is derailed from the roller 60A, 60B, or 60C.

As shown in FIG. 4, when the wire 14 is derailed from, for example, an end of the roller 60B, the derailed wire 14 contacts the contact shoe 72B of the microswitch 68B provided at the end of the roller 60B. When the wire 14 contacts the contact shoe 72B, the microswitch 68B is operated and sends the operational signal to the control apparatus.

On the other hand, when the control apparatus receives the operational signal sent from the microswitch 68B, it determines that the wire 14 is derailed from the grooved roller 22B. At the same time, the control apparatus stops driving the wire saw 10.

As described above, the wire derailment detecting apparatus of the wire saw in this embodiment detects that the derailed wire 14 contacting the microswitch 68A, 68B, or 68C in order to determine that the wire 14 is derailed. Therefore, even if the wire saw performs the slicing by means of water-based slurry, there is no problem of incorrect operation, unlike the conventional method of electrically detecting the derailment. Moreover, the derailment of the wire 14 can be instantaneously detected without fail.

In the wire derailment detecting apparatus in this embodiment, the microswitches 68A, 68B, and 68C are provided at both ends of each of the grooved rollers 22A, 22B, and 22C. As a result, it can be determined from which roller of the three grooved rollers 22A, 22B, and 22C the wire 14 is derailed.

Incidentally, in this embodiment, the microswitches 68A, 68B, and 68C are provided near both end of each of the grooved rollers 22A, 22B, and 22C. However, the microswitches 68A, 68B, and 68C may be provided at any position, if the wire 14 is derailed from the grooved roller 22A, 22B, or 22C will contact the contact shoe 72A, 72B, or 72C without fail. For example, the microswitches 68A, 68B, and 68C may be provided halfway between the rollers 22A and 22B, 22B and 22C, and 22C and 22A.

The detecting devices are not restricted to the microswitches 68A, 68B, and 68C. Any switch will do if it is operation when the derailed wire 14 contacts it. For example, a close switch or a limit switch can be used. Moreover, a contact detecting sensor may be used instead of the switch.

Furthermore, the wire derailment detecting apparatus in this embodiment may be applied to not only the wire saw performing the slicing by means of the water-based slurry, but also a wire saw performing the slicing by means of oil-based slurry.

Next, an explanation will be given about the case when the derailment of the wire from the guide roller is detected in the above-described wire saw.

Figure 5:
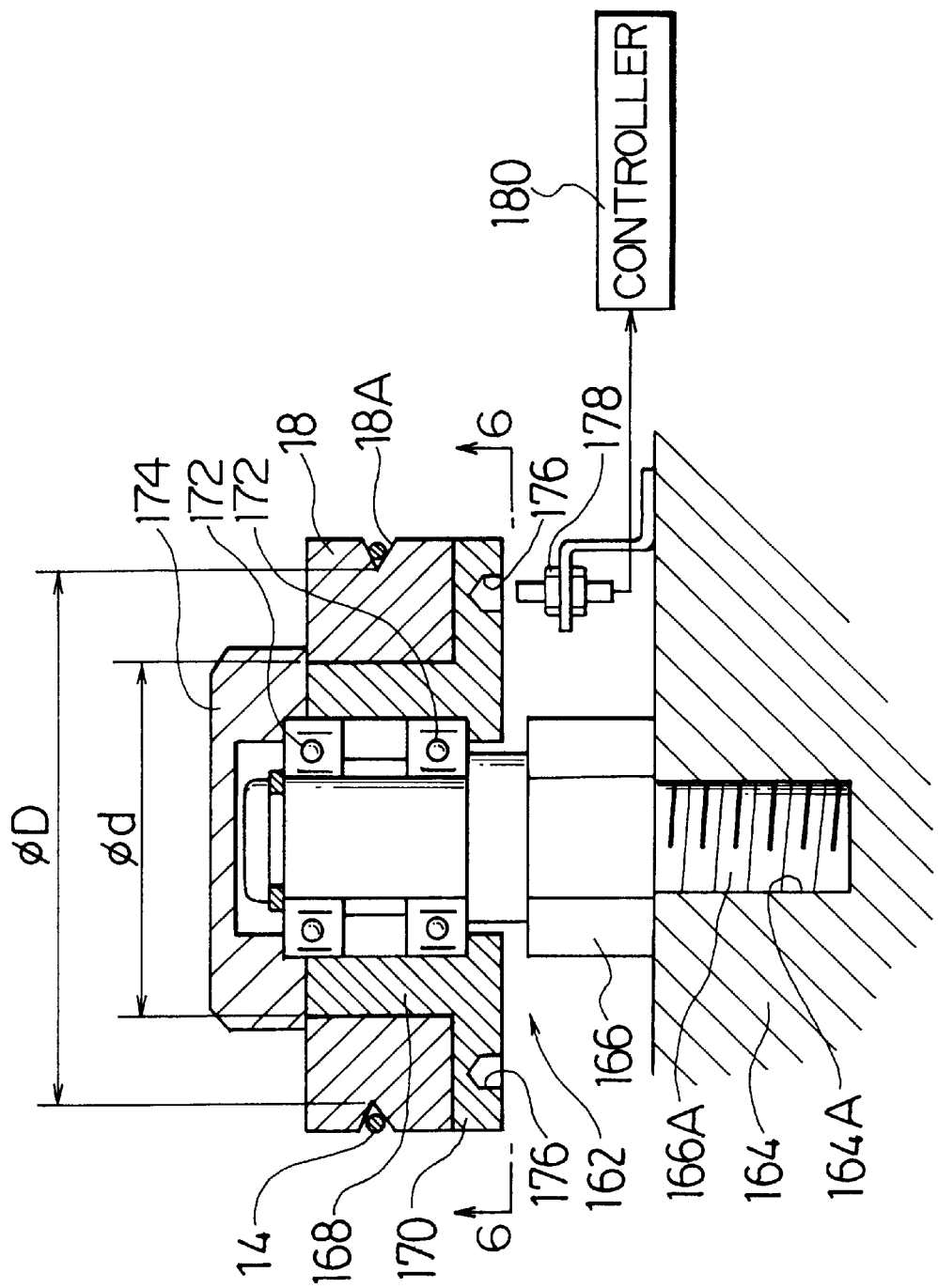
FIG. 5 is a side sectional view illustrating a wire derailment detecting apparatus.

FIG. 5 is a side sectional view illustrating the structure of the wire derailment detecting apparatus when the derailment of the wire from the guide roller is detected.

The guide roller 18 is toroidal and made of resin material such as rubber, plastic, or the like. A V-shaped groove 18A is formed on the outer circumference of the guide roller 18. The guide roller 18 is rotatably held by a bearing unit 162 provided at a body frame 164 of the wire saw.

The bearing unit 162 is composed of a shaft 166, which is fixed to the body frame 164 of the wire saw, and a rotational axis 168, which is rotatably held at the tip of the shaft 166 coaxially with the shaft 166.

The shaft 166 is fixed to the body frame 164 in such a manner that a male screw 166A at an end thereof is engaged with a screw hole 164A formed at the body frame 164 of the wire saw.

The rotational axis 168 is shaped like a cylinder, and its outside diameter is substantially equal to an inside diameter of the guide roller 18. A flange 170 is formed at an end of the rotational axis 168. The rotational axis 168 is rotatably held at the tip of the shaft 166 via the bearings 172 and 172, and an aperture at the tip of the rotational axis 168 is sealed by a cap 174.

Figure 6:
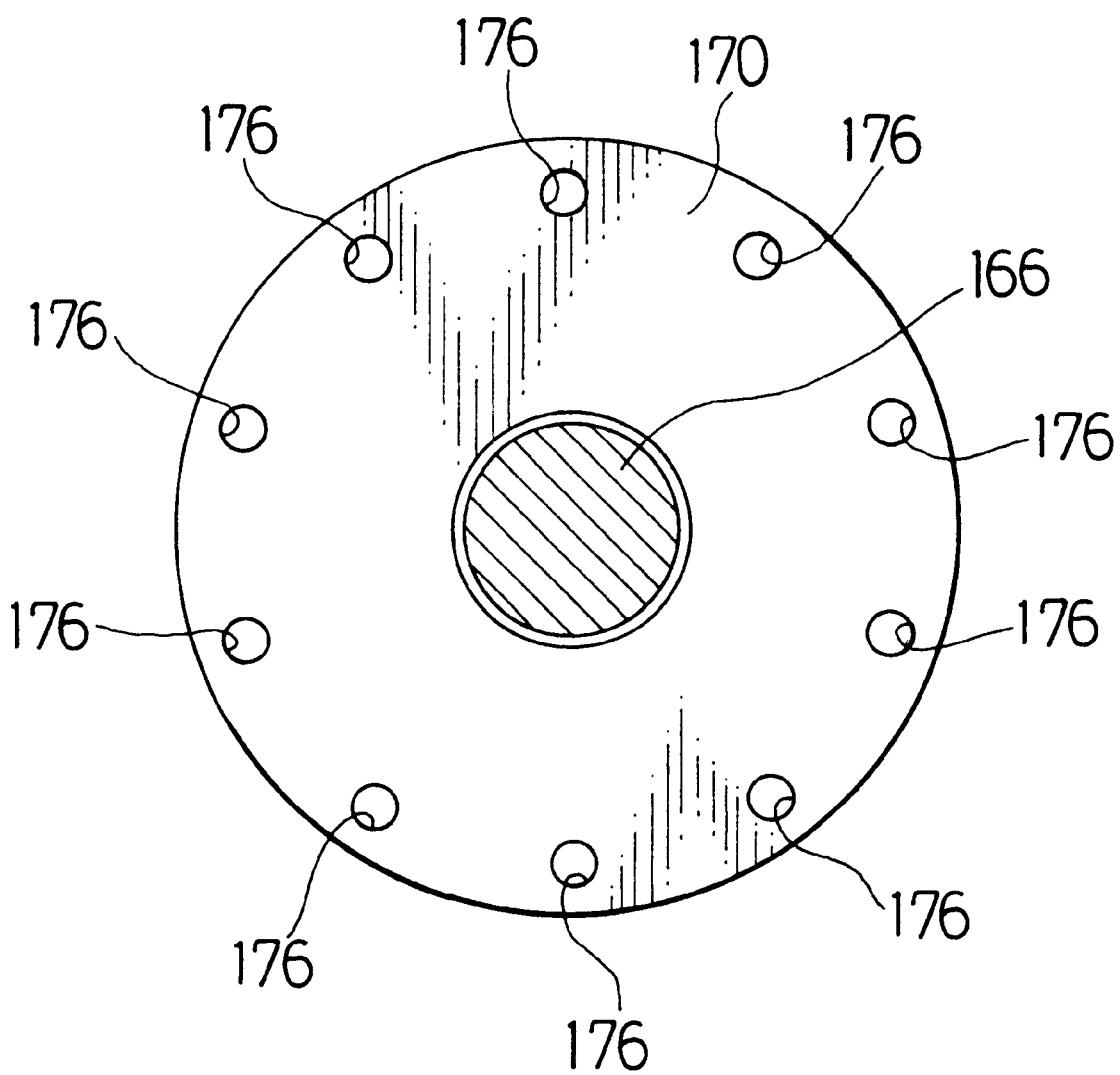
FIG. 6 is a sectional view taken along line 6—6 in FIG. 5.

As shown in FIG. 6, measurement holes 176, 176, . . . are punched at regular intervals at ten positions near an outer edge at the back side of the flange 170 formed at the rotational axis 168.

On the other hand, a close switch 178 is provided at a position of the body frame 164 of the wire saw, where the measurement holes 176 pass. The close switch 178 is operated when the measurement hole 176 passes, and sends an operational signal to a controller 180.

The controller 180 counts the operational signals sent from the close switch 178 and determines whether the wire 14 is derailed according to the counted number in the following way.

First, suppose that the wire 14 is normally wound on the guide roller 18. The number $N_0$ of operation of the close switch 178 counted by the controller 180 for a unit time T is $$N_0 = \frac{L}{\pi \times D} \times 10,$$

where L is the length in which the wire 14 travels for the unit time T and D is the diameter of the groove 18A on the guide roller 18. The number $N_0$ is the reference number of operation of the close switch 178, which is entered into the controller 180.

On the other hand, if the wire 14 is completely derailed from the guide roller 18, the guide roller 18 does not rotate, so that the close switch 178 is not operated. Therefore, the controller 180 does not count the operational signals.

In some cases, the wire 14 is derailed from the groove 18A on the guide roller 18 and enters a space between the guide roller 18 and the flange 170, and then the wire 14 is engaged with the outer circumference of the rotational axis 168. In this case, the guide roller 18 rotates, and the number $N_1$ of operation of the close switch 178 counted by the controller 180 for the unit time T is $$N_1 = \frac{L}{\pi \times d} \times 10,$$

where d is the outside diameter of the rotational axis 168. As described above, the number $N_0$ of operation of the close switch 178, which is counted by the controller 180 when the wire 14 is normally wound on the guide roller 18, is different from the number $N_1$ of operation of the close switch 178, which is counted by the controller 180 when the wire 14 is derailed from the guide roller 18.

The controller 180 counts the operational signals sent from the close switch 178 while the wire saw 10 is working, for the unit time T. Then, the controller 180 calculates the difference between the actual number X of operation of the close switch 178 and the reference number $N_0$.

If the wire 14 is normally wound on the groove 18A on the guide roller 18, the actual number X of the operation is equal to the reference number $N_0$.

However, even if the wire 14 is normally wound on the groove 18A on the guide roller 18, the actual number X of the operation is not always equal to the reference number No. This discrepancy results from the slip of the wire 14, the thinning of the abraded groove 18A on the guide roller 18, and so forth.

Therefore, if the difference between the actual number X of the operation and the reference number $N_0$ is in the predetermined permissible range, the controller 180 considers that the wire 14 is normally wound on the groove 18A on the guide roller 18. If the difference is not in the permissible range, the controller 180 determines that the wire 14 is derailed, and stops the wire saw 10 after a warning. At the same time, the controller 180 determines from which guide roller the wire 14 is derailed.

As described above, the wire derailment detecting apparatus of the wire saw in this embodiment detects the number of rotations of the guide roller 18, and according to the number determines whether the wire 14 is derailed. Therefore, even if the wire saw performs the slicing by means of the water-based slurry, there is no problem of incorrect operation, unlike the conventional method of electrically detecting the derailment. Moreover, the derailment of the wire can be instantaneously detected without fail.

Furthermore, the number of rotations of each of the guide rollers 18 is detected so that from which guide roller 18 the wire 14 is derailed can be detected.

Incidentally, the means for measuring the number of rotations of the guide roller 18 is restricted to the close switch 178 and the measurement hole 176 in this embodiment. A tachometer, an encoder, a pulse generator, or the like can be employed.

As has been described above, according to the present invention, the switches, which are operated when the derailed wire contacts thereof, are provided so that the control apparatus stops the running wire according to the operation of the switches. Therefore, there is no problem of incorrect operation, unlike the conventional method of electrically detecting the derailment, and the wire can be prevented from snapping without fail.

Moreover, the number of rotations of the guide roller during the slicing is compared with the predetermined reference number of rotations during the normal slicing, so that it is determined whether the wire is derailed. When the wire is derailed, the wire is made to stop moving. Therefore, there is no problem of incorrect operation, unlike the conventional method of electrically detecting the wire derailment, and the wire can be prevented from snapping without fail.

Incidentally, the microswitch having the contact shoe as described above may be provided near each the guide roller in order to detect the wire derailment.

It should be understood, however, that there is no intention to limit the invention to the specific forms disclosed, but on the contrary, the invention is to cover all modifications, alternate constructions and equivalents falling within the spirit and scope of the invention as expressed in the appended claims.

I claim:

1. In a wire saw, in which a wire guided by a plurality of guide rollers and travelling between a pair of wire reels is wound on a plurality of grooved rollers to form a wire row, and a workpiece is pressed against said wire row to be sliced into a number of wafers, a wire derailment detecting apparatus comprising:

means for measuring the number of rotations of each guide roller of said plurality of guide rollers while said workpiece is being sliced; and control means for comparing said number of rotations of each guide roller measured by said means for measuring the number of rotations, and a predetermined reference number of rotations of each guide roller, so as to detect whether said wire is derailed from at least one of said guide rollers.

2. The wire derailment detecting apparatus of the wire saw according to claim 1, wherein said control means stops said wire when detecting that said wire is derailed from at least one of said guide rollers.

3. The wire derailment detecting apparatus of the wire saw according to claim 1, wherein said control means warns when detecting that said wire is derailed from at least one of said guide rollers.

4. The wire derailment detecting apparatus of the wire saw according to claim 1, wherein said control means determines from which guide roller of said plurality of guide rollers said wire is derailed, by detecting the number of rotations of each guide roller of said plurality of guide rollers and comparing said number of rotations and said reference number of rotations.

5. The wire derailment detecting apparatus of the wire saw according to claim 1, wherein measurement holes are formed on an end face of each guide roller, said measurement holes being arranged on a circle concentric with said end face of said guide roller at a constant pitch; and wherein said means for measuring the number of rotations is a close switch, said close switch being operated when each of said measurement holes passes, the number of times said close switch is operated being counted by said control means so that said number of rotations of said guide roller is detected.

\* \* \* \* \*